(12) United States Patent
Hideo

(10) Patent No.: US 11,121,156 B2
(45) Date of Patent: Sep. 14, 2021

(54) ARRAY SUBSTRATE AND MANUFACTURING METHOD THEREOF

(71) Applicant: Wuhan China Star Optoelectronics Technology Co., Ltd., Hubei (CN)

(72) Inventor: Hirayama Hideo, Guangdong (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 449 days.

(21) Appl. No.: 16/087,085

(22) PCT Filed: Jan. 24, 2018

(86) PCT No.: PCT/CN2018/073958
§ 371 (c)(1),
(2) Date: Sep. 20, 2018

(87) PCT Pub. No.: WO2019/075949
PCT Pub. Date: Apr. 25, 2019

(65) Prior Publication Data
US 2020/0295056 A1 Sep. 17, 2020

(30) Foreign Application Priority Data
Oct. 20, 2017 (CN) .......................... 201710986889.9

(51) Int. Cl.
*H01L 27/12* (2006.01)

(52) U.S. Cl.
CPC ........ *H01L 27/1251* (2013.01); *H01L 27/124* (2013.01); *H01L 27/127* (2013.01); *H01L 27/1222* (2013.01); *H01L 27/1237* (2013.01)

(58) Field of Classification Search
CPC ............. H01L 27/1251; H01L 29/7865; H01L 29/78678; H01L 29/78648; H01L 27/1225;
(Continued)

(56) References Cited

U.S. PATENT DOCUMENTS 5,063,378 A * 11/1991 Roach .................. G09G 3/3677
345/90
2009/0278121 A1* 11/2009 Kakkad ............... G02F 1/13318
257/43
(Continued)

FOREIGN PATENT DOCUMENTS

CN 102013432 A 4/2011
CN 106558593 A 4/2017
(Continued)

OTHER PUBLICATIONS

CN2017109868899_1ST Office Action.

*Primary Examiner* — Amar Movva
(74) *Attorney, Agent, or Firm* — Leong C. Lei

(57) ABSTRACT

An array substrate includes first and second thin-film transistors formed on a base and spaced by a predetermined distance in a first direction that is parallel to the plane on which the base is located and set in parallel. The first thin-film transistor includes a first active layer, a first gate insulation layer, a first gate electrode, a first interlayer insulation layer, and first source/drain electrodes sequentially stacked on the base in a third direction that is perpendicular to the first direction. The first source/drain electrodes are electrically connected to the first active layer. The second thin-film transistor includes a second gate electrode, a second gate insulation layer, second source/drain electrodes, and a second active layer sequentially stacked on the base in the third direction. The first active layer and the first gate
(Continued)

electrode are both formed of a poly-silicon material. The second active layer includes an oxide semiconductor material.

8 Claims, 5 Drawing Sheets

(58) Field of Classification Search
CPC ......... H01L 29/7869–78693; H01L 29/78693; H01L 27/1237; H01L 27/127
See application file for complete search history.

(56) References Cited

U.S. PATENT DOCUMENTS

| | | |
|---|---|---|
| 2017/0117303 A1 | 4/2017 | Lee et al. |
| 2017/0125452 A1* | 5/2017 | Ide ..................... H01L 27/1225 |
| 2017/0221975 A1 | 8/2017 | Lee et al. |

FOREIGN PATENT DOCUMENTS

| | | |
|---|---|---|
| CN | 106803510 A | 6/2017 |
| CN | 106876412 A | 6/2017 |
| CN | 107039460 A | 8/2017 |
| WO | 2015194417 A1 | 12/2015 |

\* cited by examiner

ARRAY SUBSTRATE AND MANUFACTURING METHOD THEREOF

CROSS REFERENCE TO RELATED APPLICATIONS

This application claims the priority of Chinese Patent Application No. 201710986889.9 filed on Oct. 20, 2017, titled "Array Substrate and Manufacturing Method Thereof", the disclosure of which is incorporated herein by reference in its entirety.

BACKGROUND OF THE INVENTION

1. Field of the Invention

The present invention relates to the field of display technology, and more particularly to the field of technology for manufacturing array substrates of display devices.

2. The Related Arts

Display screens have been increasingly widely used in electronic devices of various fields of production and living of human beings, such as the sector of consumer electronics including mobile phones, tablet computers, and desktop computers, the sector of household electronic devices including televisions, or the sector of public facility domain including outdoor advertisement.

The main-stream display screens that are currently available include liquid crystal displays (LCDs) and organic light emitting diode (OLED) displays. To improve the displaying performance of the displays, including both large-sized display screens for outdoor applications and small-sized display screens for electronic electronics applications, more and more people have devoted themselves to slim edge-frame designs. A slim edge-frame display device could effectively lower the areas of non-display zones of joint display screens and thus effectively increases a screen ratio and significantly improves overall displaying performance. Thus, slim edge frame is an issue to be addressed in the field of display devices.

SUMMARY OF THE INVENTION

To resolve the issue of slim edge frame, the present invention provides an array substrate having a relatively small size.

A manufacturing method of such an array substrate is also provided.

An array substrate comprises a first thin-film transistor and a second thin-film transistor that are arranged on a base to be spaced from each other by a predetermined distance in a first direction and set in parallel. The first direction is parallel to a plane on which the base is located. The first thin-film transistors comprises, sequentially stacked on one side of the base in a third direction, a first active layer, a first gate insulation layer, a first gate electrode, a first interlayer insulation layer, and first source/drain electrodes. The first source/drain electrodes is electrically connected to the first active layer. The second thin-film transistors comprises, sequentially stacked on one side of the base in the third direction, a second gate electrode, a second gate insulation layer, second source/drain electrodes, and a second active layer. The first active layer and the first gate electrode are both formed of a poly-silicon material and the second active layer comprises an oxide semiconductor material. The third direction is perpendicular to the first direction.

A method for manufacturing a display panel comprises the following steps:

providing a base plate and forming a buffer layer on one side of the base plate;

forming and patterning a poly-silicon layer on a surface of the buffer layer to form a first active layer and a second gate electrode that are spaced from each other by a predetermined distance that are spaced from each other by a predetermined distance in a first direction;

forming, sequentially on a surface of the first active layer in a third direction, a first gate insulation layer and a first gate electrode that are stacked, the third direction being perpendicular to the first direction and extending in a direction away from the base;

forming an insulation layer on the first gate electrode, the first gate insulation layer, and the second gate electrode, wherein a portion of the insulation layer that corresponds to and covers the first gate insulation layer and the first gate electrode forms a first interlayer insulation layer; and a portion of the insulation layer that corresponds to and covers the second gate electrode forms a second gate insulation layer;

forming a metal layer on the first interlayer insulation layer and the second gate insulation layer;

subjecting amorphous materials of the first active layer and the first gate electrode to ion activation/hydrogenation;

patterning the metal layer, wherein first source/drain electrodes are formed at locations corresponding to two sides of the first gate electrode in the first direction and the first source/drain electrodes are electrically connected to the first active layer, the first active layer, the first gate insulation layer, the first gate electrode, the first interlayer insulation layer, and the first source/drain electrodes collectively forming a first thin-film transistor; second source/drain electrodes being formed at locations corresponding to two sides of the second gate electrode in the first direction; and forming a second active layer to correspond to the second source/drain electrodes, the second gate electrode, the second gate insulation layer, the second source/drain electrodes, and the second active layer collectively forming a second thin-film transistor.

Different from the prior art, the first thin-film transistor and the second thin-film transistor are formed simultaneously so that there is no need for conducting separate fabrication of the second thin-film transistor arranged in a driving circuit thereby improving the manufacturing efficiency.

Further, the second thin-film transistor that comprises an active layer formed of an oxide semiconductor has a channel that is of a relatively small size so that in each pixel, the thin-film transistor occupies a reduced amount of space to thereby effectively increase a size of a display area of a display panel and increase an aperture ratio. Also, in a non-display area, the poly-silicon made first thin-film transistor is provided as a switching thin-film transistor of the driving circuit so that the scan driver circuit or the data driver circuit is made small in size and fast in response thereby reducing the size of the non-display area to achieve the purpose of increasing the screen to surface ratio and slimming the edge frame.

BRIEF DESCRIPTION OF THE DRAWINGS

To more clearly explain the technical solution of the present invention, a brief description of the drawings that are necessary for embodiments of the present invention is given below. It is obvious that the drawings that will be described below show only some embodiments of the present invention. For those having ordinary skills of the art, other drawings may be available from these attached drawings without the expense of creative effort and endeavor.

DETAILED DESCRIPTION OF THE PREFERRED EMBODIMENTS

A clear and complete description will be given below to technical solutions provided by embodiments of the present invention with reference to the attached drawings of the embodiments of the present invention. However, the embodiments described are only some, but not all, of the embodiments of the present invention. Other embodiments that are available to those having ordinary skills of the art based on the embodiment of the present invention, without the expense of creative effort and endeavor, are considered belonging to the scope of protection of the present invention.

A specific embodiment of an array substrate of the present invention will be described with reference to the attached drawings.

Figure 1:
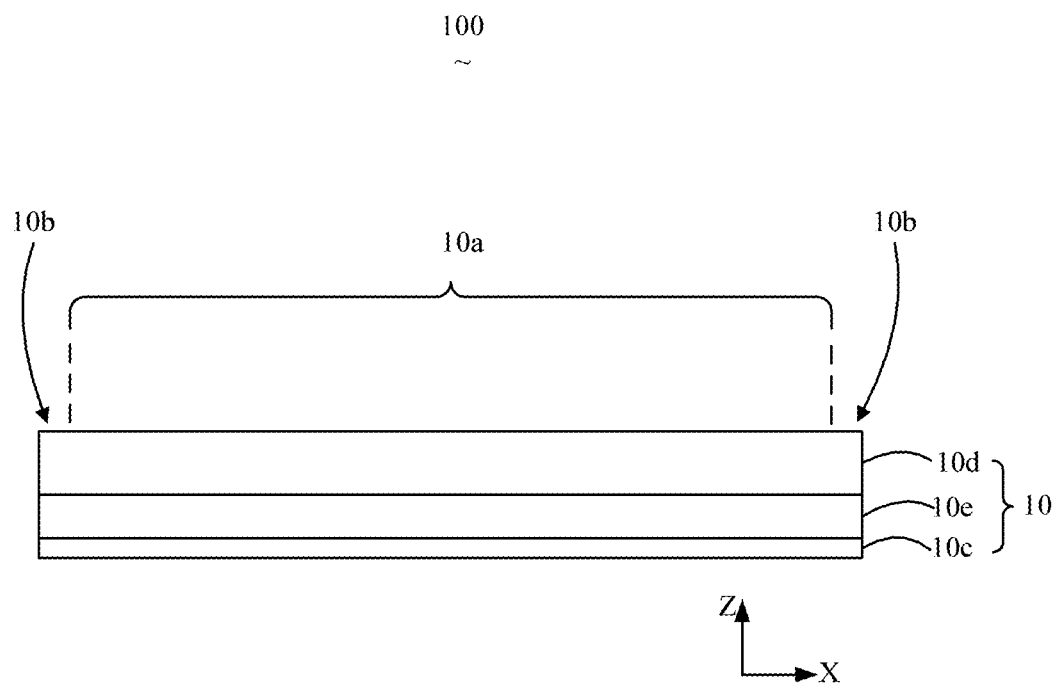
FIG. 1 is a schematic view illustrating a structure of a display device according to an embodiment of the present invention.

Referring to FIG. 1, FIG. 1 is a schematic view illustrating a structure of a display device according to an embodiment of the present invention. As shown in FIG. 1, the display device 100 comprises a display panel 10 and other auxiliary structures (not shown), wherein the auxiliary structures illustrated comprise an enclosure and a supporting structure.

The display panel 10 comprises an image display area 10a for displaying an image and a non-display area 10b. The display area 10a serves to display an image and the non-display area 10b surrounds a periphery of the display area 10a to serve as a non-light-emitting zone and does not display an image. The display panel 10 further comprises an array substrate 10c and an opposite substrate 10d, and a display medium layer 10e interposed and arranged between the array substrate 10c and the opposite substrate 10d. In the instant embodiment, the display medium comprises an organic electroluminescence diode (OLED). Certainly, in other alternative embodiments of the present invention, the display panel 10 of the display device 100 may comprise a display medium of a liquid crystal material, but not limited thereto. For easy illustration, a three-dimensional Cartesian coordinate system defined by a first direction X, a second direction Y, and a third direction Z that are mutually perpendicular to each other is first provided, wherein a thickness direction of the display device 100 is in the third direction Z.

Figure 2:
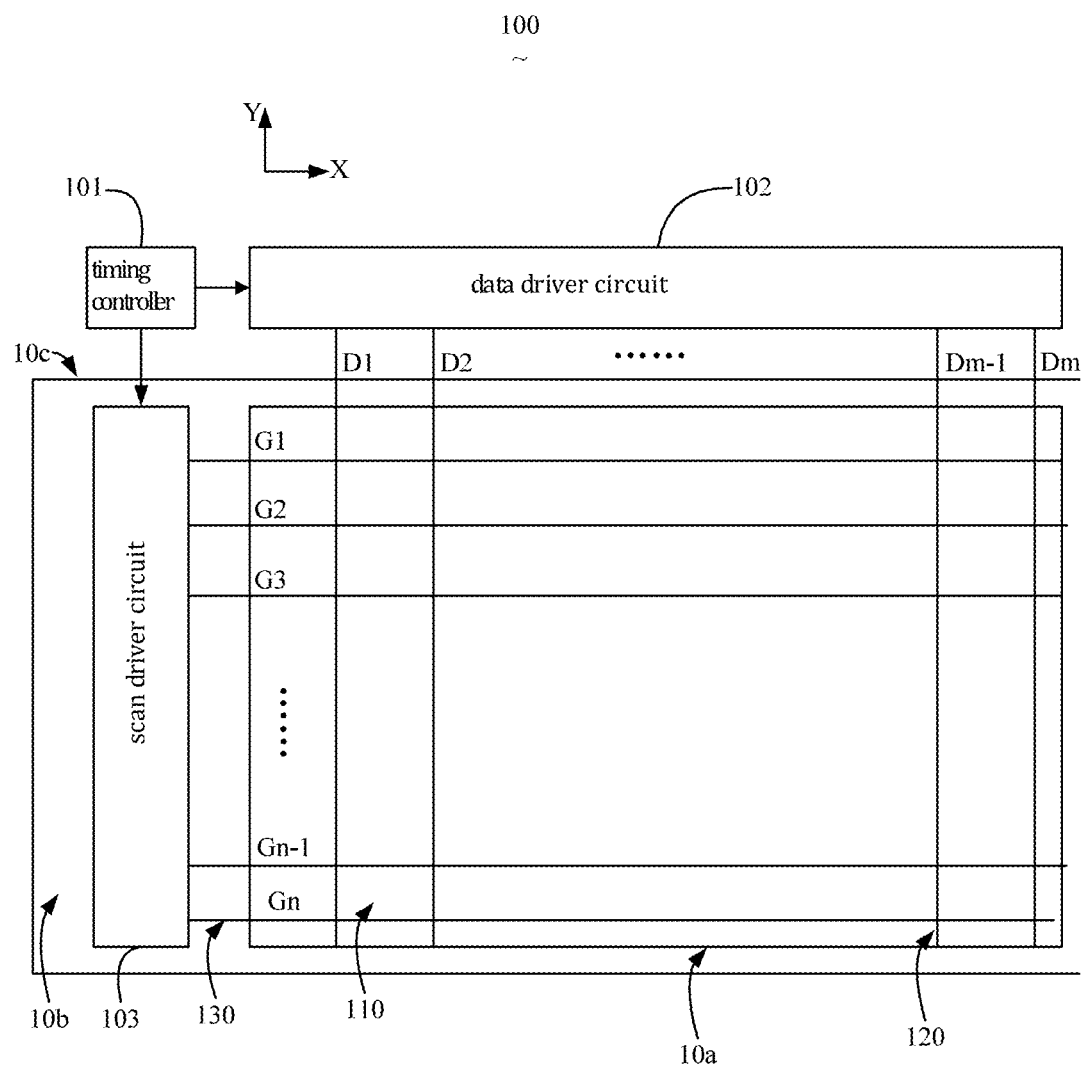
FIG. 2 is a schematic planar view illustrating a structure of an array substrate of a display panel shown in FIG. 1.

Referring to FIG. 2, which is a schematic planar view illustrating a structure of the array substrate 10c of the display panel 10 shown in FIG. 1, as shown in FIG. 2, the array substrate 10c has a first area (not labeled) that corresponds to the image display area 10a and comprises a plurality of pixels arranged in an m*n array 110, m data lines 120, and n scan lines 130, where m and n are each a natural number that is greater than 1.

The plurality of data lines 120 are arranged at intervals of a first predetermined distance to be spaced from each other in the first direction Y so as to be insulated from and parallel with each other. The plurality of scan lines 130 are arranged at intervals of a second predetermined distance to be spaced from each other in the second direction X so as to be insulated from and parallel with each other. Further, the plurality of scan lines 130 and the plurality of data lines 120 are insulated from each other, and the first direction X and the second direction Y are mutually perpendicular. For easy illustration, the m data lines 120 are respectively defined as D1, D2, . . . , Dm−1, and Dm; and the n scan lines 130 are respectively defined as G1, G2, . . . , Gn−1, and Gn. The plurality of pixels 110 are respectively located in the array defined by the plurality of data lines 120 and the scan lines 130 and are electrically connected with the data line 120 and the scan line 130 corresponding thereto.

Corresponding to the non-display area 10b of the display panel 10, the display device 100 (FIG. 1) further comprises, arranged in the non-display area 10b, a control circuit 101, a data driver circuit 102, and a scan driver circuit 103 that are provided for driving the plurality of arrayed pixels 110 to display an image and are arranged in a second area (not labeled) of the array substrate 11c. The data driver circuit 102 is electrically connected to the plurality of data lines 120 to transmit image data to be displayed, in the form of data voltages, through the plurality of data lines 120 to the plurality of pixels 110. The scan driver circuit 103 is electrically connected with the plurality of scan lines 130 to supply, through the plurality of scan lines 130, a scan signal for controlling the time when the pixels 110 receives image data to display an image. The control circuit 101 is electrically connected with the data driver circuit 102 and the scan driver circuit 103 to control operation timing of the data driver circuit 102 and the scan driver circuit 103, namely supplying corresponding timing control signals to the data driver circuit 102 and the scan driver circuit 103.

In the instant embodiment, the scan driver circuit 103 is directly set in the non-display area 10b of the display panel 10, while the control circuit 101 and the data driver circuit 102 are independently of the array substrate 10c and are set on other carrying circuit boards. In the instant embodiment, electronic components of the scan driver circuit 103 are formed, through the same manufacturing operation as that of the pixels 110 of the display panel 10, on the display panel 10, namely the so-called GOA (Gate on Array) technology.

Figure 3:
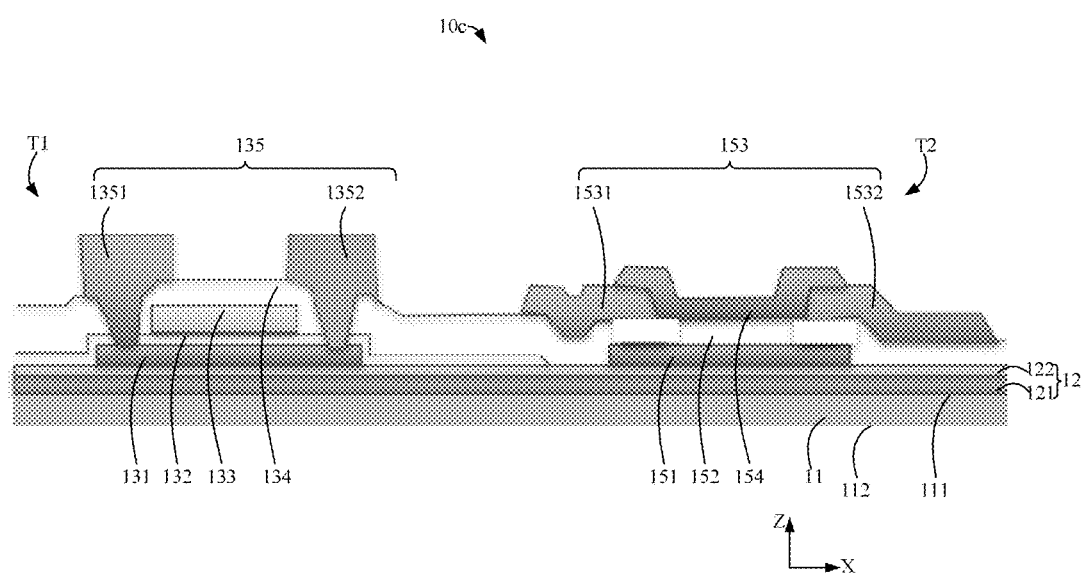
FIG. 3 is a schematic view illustrating a sideways structure of the array substrate shown in FIGS. 1 and 2.

Referring to FIG. 3, a schematic view illustrating a sideways structure of the array substrate shown in FIGS. 1 and 2 is provided.

As shown in FIG. 3, the array substrate 10c comprises a base 11. The base 11 is formed of a material of transparent glass or plastics. The base 11 has a first surface 111 and a second surface 112 that are opposite to each other. The first surface 111 are formed with a first thin-film transistor T1 and a second thin-film transistors T2 that are spaced from each other in the first direction X by a predetermined distance and are set in parallel. The first direction X and the second direction Y are both parallel to the plane on which the base 11 is located.

It is noted that in the instant embodiment, the first thin-film transistor T1 is a low temperature poly-silicon (LTPS) active layer based thin-film transistor and the second thin-film transistors T2 is an oxide semiconductor based thin-film transistor, such as a thin-film transistor comprising an active layer formed of indium gallium zinc oxide (IGZO).

The first thin-film transistors T1 is arranged in the scan driver circuit 103 or the data driver circuit 102 to conduct scanning or supplying of a data signal to each of the pixels 110 of the display area 10a. The second thin-film transistors T2 is arranged in each of the pixels 110 and is electrically connected to a pixel electrode Px to drive the pixel electrode Px to display an image.

The base 11 is provided thereon with a buffer layer 12. The buffer layer 12 comprises a first sub buffer layer 121 and a second sub buffer layer 122 stacked, in sequence, in the third direction Z, meaning the first buffer layer 121 is arranged on the first surface 111 of the base 11 and the second sub buffer layer 122 is arranged on a surface of the first sub buffer layer 121 that is distant from the first surface 111. The first sub buffer layer 121 comprises a silicon oxide (SiOx) film, and the second sub buffer layer comprises a silicon nitride (SiNx) film.

Specifically, the stack of the silicon nitride and silicon oxide films has a thickness of 50-100 nm. Also, a ratio between thicknesses of the silicon nitride layer and the silicon oxide layer is 1-1.5:0.8-1.6. For example, the ratio of the thicknesses of the silicon nitride layer and the silicon oxide layer is 1:1. For example, the silicon oxide layer has a thickness of 20-60 nm. A reactant gas that is used to form the SiNx film comprises a mixture gas of $SiH_4$, $NH_3$, and $N_2$, or a mixture gas of $SiH_2Cl_2$, $NH_3$, and $N_2$; and a reactant gas that is used to form the SiOx film comprises a mixture gas of $SiH_4$ and $N_2O$ or a mixture gas of $SiH_4$ and ethyl silicate (TEOS).

The first thin-film transistor T1 comprises, sequentially stacked on a surface of the buffer layer 12 in the third direction Z, a first active layer 131, a first gate insulation layer 132, a first gate electrode 133, a first interlayer insulation layer 134, and first source/drain electrodes 135, wherein the first source/drain electrodes 135 are respectively and electrically connected, through first through holes H1, to the first active layer 131. Specifically, the first source/drain electrodes 135 comprise a first source electrode 1351 and a first drain electrode 1352 that are respectively arranged on two sides of the first gate electrode 133 in the first direction X and are respectively and electrically connected, through the two first through holes H1, to the opposite side portions of the first active layer 131 in the first direction X.

The second thin-film transistor T2 comprises, sequentially stacked on a surface of the buffer layer 12 in the third direction Z, a second gate electrode 151, a second gate insulation layer 152, second source/drain electrodes 153, and a second active layer 154. The second active layer 154 is arranged on a surface of the second source/drain electrodes 153 that is distant from the base 11. Specifically, the second source/drain electrodes 153 comprise a second source electrode 1531 and a second drain electrode 1532 that are spaced from each other by a predetermined distance in the first direction X. The second active layer 154 extends in the first direction X and covers a portion of the second source electrode 1531 and a portion of the second drain electrode 1532 so as to have the second active layer 154 electrically connected to the second source electrode 1531 and the second drain electrode 1532.

In the instant embodiment, the first active layer 131 and the first gate electrode 151 are located in a structure of the same layer and are formed in the same fabrication operation and are of materials that are both low temperature poly-silicon (p-Si).

The first interlayer insulation layer 134 and the second gate insulation layer are located in a structure of the same layer and are formed in the same fabrication operation and are both of a silicon oxide material.

The first source/drain electrodes 135 and the second source/drain electrodes 153 are both formed of an aluminum metal material. The first source/drain electrodes 135 and the second source/drain electrodes 153 are formed through patterning an aluminum metal layer that is formed on a surface of the interlayer insulation layer 134. Before patterning of the aluminum metal layer, amorphous material of the first active layer 131 and the first gate electrode 131 are subjected to treatment of ion activation/hydrogenation so as to restore and eliminate internal an interfacial defects of the amorphous material of the first active layer 131 and the first gate electrode 131.

The second active layer 154 is formed of an oxide semiconductor material. Specifically, the second active layer 154 is formed of indium gallium zinc oxide (IGZC). The second thin-film transistor T2 serves as a driver thin-film transistor of a pixel 110 (FIG. 2). The IGZO thin-film transistor has a small size and volume and has relatively high stability of threshold voltage Vth.

Preferably, the first active layer 131 comprises a phosphor (P) doped poly-silicon material so that the first thin-film transistors T1 is structured as a top-gate P type thin-film transistor. The second active layer 154 comprises a nitrogen (N) doped oxide semiconductor so that the second transistor T2 is structured as a bottom-gate N type thin-film transistor.

Different from the prior art, the first thin-film transistor T1 of the pixel 110 that functions for driving and the second thin-film transistor T2 that is arranged in the driving circuit provided in the non-display area 10b are formed simultaneously so that there is no need for conducting separate fabrication of the second thin-film transistor T2 arranged in the driving circuit thereby improving the manufacturing efficiency.

Also, the second thin-film transistor T2 that comprises an active layer formed of an oxide semiconductor has a channel that is of a relatively small size so that in each of the pixels, the thin-film transistor occupies a reduced amount of space to thereby effectively increase the size of the display area 10a of the display panel 10 and increase the aperture ratio. Also, in the non-display area 10b, the poly-silicon made first thin-film transistor T1 is provided as a switching thin-film transistor of the driving circuit so that the scan driver circuit or the data driver circuit is made small in size and fast in response thereby reducing the size of the non-display area 10b to achieve the purpose of increasing the screen to surface ratio and slimming the edge frame.

Figure 4:
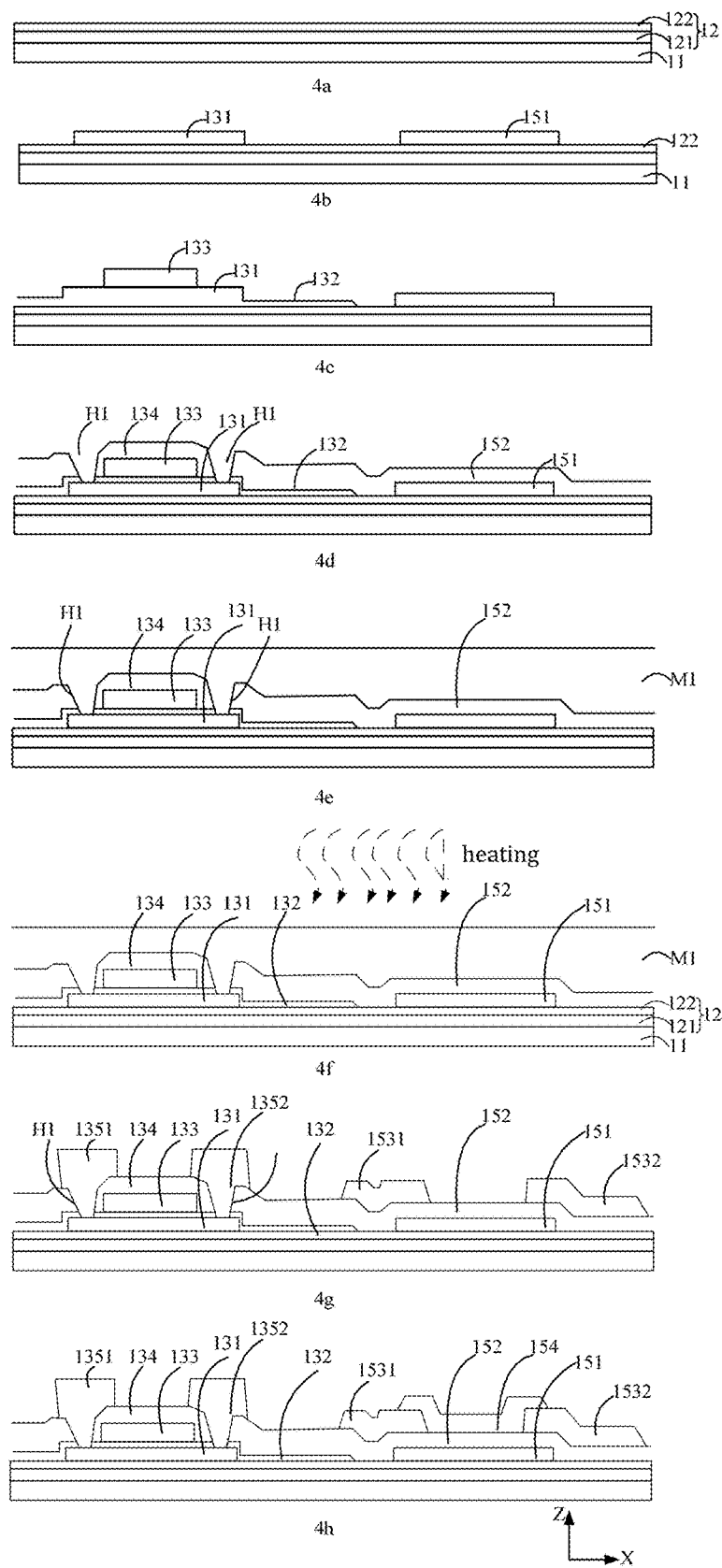
FIG. 4 is a schematic view showing a sideways structure corresponding to each step of a manufacturing method of an array substrate shown in FIG. 3.
Figure 5:
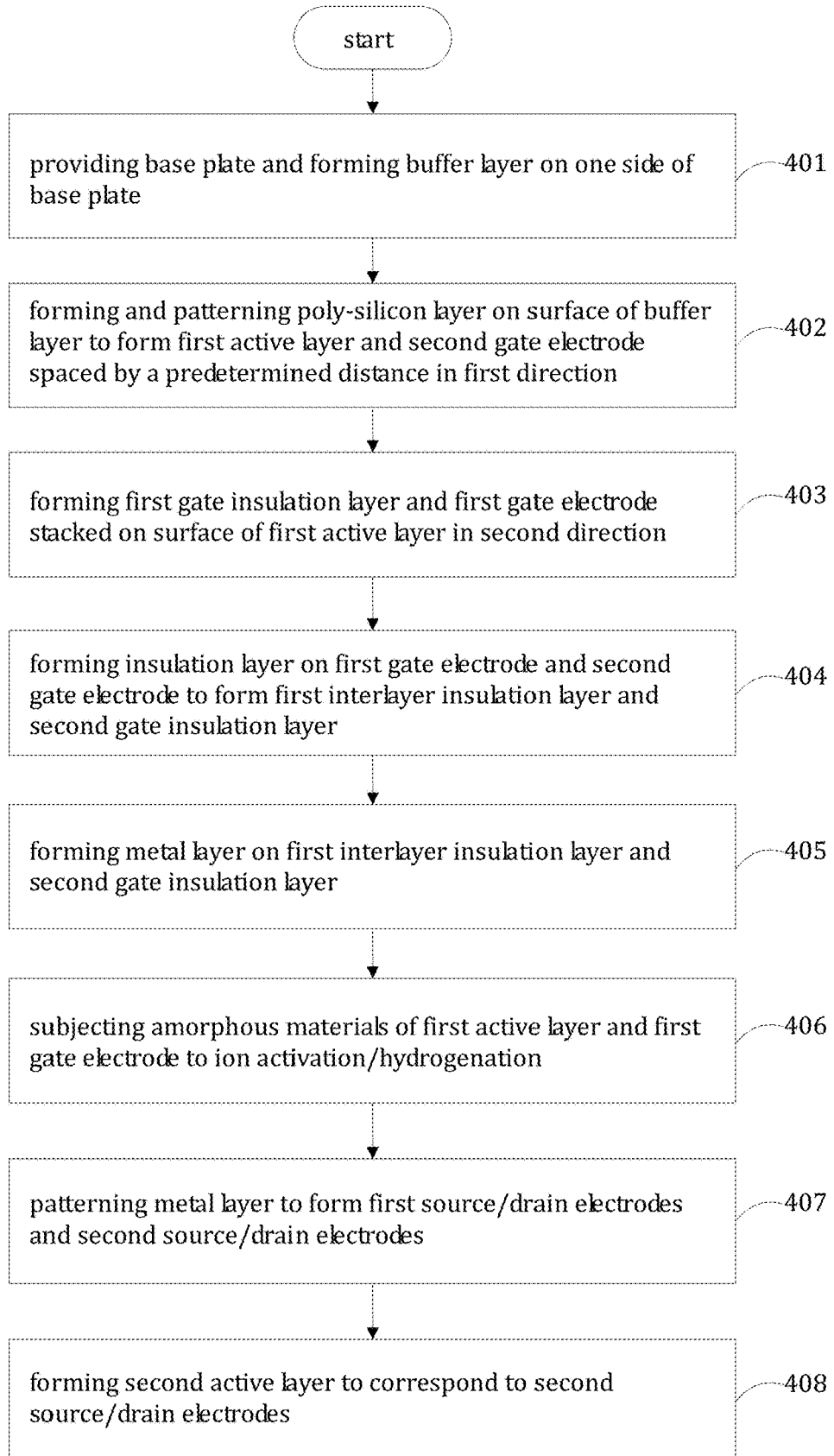
FIG. 5 is a flow chart illustrating the manufacturing method of the array substrate shown in FIG. 3.

Referring to FIG. 4, a schematic view showing a sideways structure corresponding to each step of a manufacturing method of the array substrate 10c shown in FIG. 3 is provided. FIG. 5 is a flow chart illustrating the manufacturing method of the array substrate shown in FIG. 3. A description to the manufacturing steps of the array substrate 10c will be provided below with reference to FIGS. 3-5.

Step 401, as shown in part 4a of FIG. 4, providing a base plate 11 and forming a buffer layer 12 on a first surface 111 that is on one side of the base plate 11.

Preferably, plasma enhanced chemical vapor deposition (PECVD) is applied to deposit a film of the first sub buffer layer 121 and the second sub buffer layer 122, which is of a predetermined thickness, on the first surface of the base 11. For example, the predetermined thickness is 50-100 nm. The material of deposition for the first sub buffer layer 121 can be a silicon oxide (SiOx) film, and the material of deposition for the second sub buffer layer 122 can be a silicon nitride (SiNx) film.

Step 402, as shown in part 4b of FIG. 4, forming a poly-silicon layer on a surface of the second sub buffer layer 122 and conducting patterning to form a first active layer 131 and a second gate electrode 151, which are spaced by a predetermined distance in a first direction X.

Specifically, a plasma enhanced chemical vapor deposition (PECVD) operation is applied to deposit an amorphous silicon layer on a surface of the buffer layer 12 that is distant from the base plate and then, irradiating with laser is conducted to have the amorphous silicon layer converted into a poly-silicon layer, wherein deposition temperature is generally controlled to be below 500° C. and the thickness of the amorphous silicon layer is 40 nm-50 nm. Certainly, the thickness can be properly selected according to a specific operation involved.

The poly-silicon layer is then subjected to patterning, wherein patterning is a pattern-forming operation that carries out etching on a portion of the amorphous silicon layer to have the amorphous silicon layer forming the first active layer 131 and the first gate electrode 151. In the instant embodiment, etching of the poly-silicon layer can be carried out with a known wet etching process or dry etching process.

Step 403, as shown in part 4c of FIG. 4, forming, sequentially on a surface of the first active layer 131 in the third direction Z, a first gate insulation layer 132 and a first gate electrode 133 that are stacked.

Specifically, a plasma enhanced chemical vapor deposition operation is applied at a location corresponding to the first active layer 131 to deposit, on a surface of the first active layer 131 that is distant from the base plate, a silicon nitride and/or silicon oxide film having a predetermined thickness and then, a metal layer is deposited on the silicon nitride and/or silicon oxide film. The metal layer is formed of a material comprising molybdenum (Mo) or copper (Cu), and then, the metal layer is subjected to patterning to form the first gate electrode 133.

Preferably, after the formation of the first gate electrode 133, ion implantation is applied to form source and drain areas in the first active layer 131 respectively corresponding to two opposite sides of the first gate electrode 133 in the first direction X.

Step 404, as shown in part 4d of FIG. 4, forming an insulation layer on the first gate electrode 133, the first gate insulation layer 132, and the second gate electrode 151, wherein a portion of the insulation layer that corresponds to and covers the first gate insulation layer 132 and the first gate electrode 133 forms a first interlayer insulation layer 134; and a portion of the insulation layer that corresponds to and covers the second gate electrode 151 forms a second gate insulation layer 152.

Specifically, a PECVD operation is applied to form a silicon oxide (SiOx) film of a predetermined thickness on a surface of the first gate electrode 133, the first gate insulation layer 132, and the second gate electrode 151 that is distant from the base plate. The silicon oxide film serves as the insulation layer. A thickness of the insulation layer in the third direction Z is greater than a thickness of the first gate insulation layer 132.

It is noted that after being formed, the insulation layer is subsequently formed first through holes H1 at locations respectively corresponding to the source and drains areas of the first active layer 131 corresponding to two opposite sides of the first gate electrode 133 in the first direction X and the through holes extend through the first interlayer insulation layer 134 and the first gate insulation layer 132, so as to have portions of the first active layer 131 exposed.

Step 405, as shown in part 4e of FIG. 4, forming a metal layer M1 on the first interlayer insulation layer 134 and the second gate insulation layer 152. After the metal layer M1 is formed, the metal layer M1 is electrically connected through H1 to the first active layer 131. In the instant embodiment, the metal layer M1 is formed of a material comprising aluminum (Al).

Step 406, as shown in part 4f of FIG. 4, subjecting amorphous materials of the first active layer 131 and the first gate electrode 151 to ion activation/hydrogenation on.

Specifically, nitrogen plasma treatment is carried out, through the metal layer M1, on the first interlayer insulation layer 134 and the second gate insulation layer 152 with low temperature annealing conducted at the same time, followed by ion activation and hydrogenation, wherein during hydrogenation, the SiNx films of the buffer layer 12 and the first gate insulation layer 132 that are respectively adjacent to two surfaces of the first active layer 131 serve as a source of hydrogen, where hydrogen atoms H are transferred, under a condition of heating, to the first active layer 131 and the first gate electrode 151 so as to repair suspending bonds of non-bonding orbitals present in the interface of the poly-silicon material and the silicon oxide (SiOx) film of the first active layer 131 and the first gate electrode 151 so as to increase the density of the interface of the poly-silicon film. In the instant embodiment, a temperature for the low temperature annealing is 350-450° C. and the time for low temperature annealing is 20-40 minutes. Certainly, and alternatively, adjustment can be made according to practical requirements.

In the instant embodiment, since the first interlayer insulation layer 134 and the second gate insulation layer 152 are formed of silicon oxide (SiOx), the bond distance in silicon oxide is generally around 0.151 nm (nanometer), while the distance of hydrogen bond is greater than 0.2 nm, the first interlayer insulation layer 134 and the second gate insulation layer 152 could effectively block H atoms from escaping out and thus serving as a better hydrogen blocking layer. Further, the metal layer M1 has a coefficient of diffusion that is around $1.8E-12$ $cm^2/s$, and thus, it is apparent that the metal layer M1 has a better effect of blocking hydrogen atoms, meaning it is a better hydrogen blocking layer. By means of the first interlayer insulation layer 134 and the second gate insulation layer 152, in combination with the metal layer M1, hydrogen atoms in the buffer layer 12 and the first gate insulation layer 132 can be effectively prevented from escaping in a direction of the metal layer M1 away from the base 11, meaning hydrogen atoms of the buffer layer 12 and the first gate insulation layer 132 can be better transferred to the first active layer 131 and the first gate electrode 151 to improve the effect of hydrogenation of the first active layer 131 and the first gate electrode 151.

Step 407, as shown in part 4g of FIG. 4, patterning the metal layer M1 to form a first source electrode 1351 and a first drain electrode 1352 of first source/drain electrodes 135 at locations corresponding to two sides of the first gate electrode 133 in the first direction X, such that the first source/drain electrodes 135 are electrically connected to the first active layer 131, so that the first active layer 131, the first gate insulation layer 132, the first gate electrode 133, the first interlayer insulation layer 134, and the first source/drain electrodes 135 collectively form a first thin-film transistor T1. A second source electrode 1531 and a second drain electrode 1532 of second source/drain electrodes 153 are formed at locations corresponding to two sides of the second gate electrode 151 in the first direction X.

Step 408, as shown in part 4h of FIG. 4, forming a second active layer 154 to correspond to the second source/drain electrodes 153, so that the second gate electrode 151, the second gate insulation layer 152, the second source/drain electrodes 153, and the second active layer 154 collectively form a second thin-film transistor T2.

Specifically, a IGZO material is deposited on the second source/drain electrodes 153 to form a IGZO film, and then, pattern forming is applied to subject the IGZO film to patterning to form the second active layer 154. The second active layer 154 covers portions of the second source electrode 1531 and the second drain electrode 1532 of the second source/drain electrodes 153 so that the active layer 154 is electrically connected to the second source electrode 1531 and the second drain electrode 1532. Also, a portion of the second active layer 154 that covers the second gate insulation layer 152 exposed between the second source electrode 1531 and the second drain electrode 1532 to form a conductive channel of the second thin-film transistor T2.

Before the formation of the second active layer 154, the array substrate 10c has already completed with the hydrogenation operation so that it is possible to prevent excessive hydrogen atoms contained in the second active layer 154. Preferably, the hydrogen content of the second active layer 154 is less than $6E20$ atoms/cm$^3$, in order to stabilize the threshold voltage Vth of the second thin-film transistor T2.

It is appreciated that a pixel electrode (not shown) may subsequently be formed on the second source/drain electrodes 135, wherein the second source electrode 1351 or the second drain electrode 1352 is electrically connected with the pixel electrodes (not shown).

The embodiments described above are not construed as constraining to the scope of protection of the technical solutions so provided. Modifications, equivalent substitutes, and improvements within the spirit and principle of the above-described embodiments are considered belonging the scope of protection of those technical solutions.

What is claimed is:

1. An array substrate, comprising a first thin-film transistor and a second thin-film transistor that are arranged on a base to be spaced from each other by a predetermined distance in a first direction and set in parallel, the first direction being parallel to a plane on which the base is located, wherein:
    the first thin-film transistor comprises, sequentially stacked on one side of the base in a third direction, a first active layer, a first gate insulation layer, a first gate electrode, a first interlayer insulation layer, and first source/drain electrodes, the first source/drain electrodes being electrically connected to the first active layer; and
    the second thin-film transistor comprises, sequentially stacked on one side of the base in the third direction, a second gate electrode, a second gate insulation layer, second source/drain electrodes, and a second active layer;
    wherein the first active layer and the second gate electrode are both formed of a poly-silicon material and the second active layer comprises an oxide semiconductor material, the third direction being perpendicular to the first direction;
    wherein the base has a surface on which a buffer layer is further provided, the first active layer and the second gate electrode being both arranged on a surface of the buffer layer that is distant from the base, the buffer layer comprising a silicon oxide layer and a silicon nitride layer, wherein the silicon nitride layer is closer to the first active layer and the second gate electrode than the silicon oxide layer, such that the buffer layer is located between the base and each of the first active layer and the second gate electrode and each of the first active layer and the second gate electrode is in direct contact with the silicon nitride layer of the buffer layer, wherein the direct contact between the silicon nitride of the buffer layer and each of the first active layer and second gate electrode allows the silicon nitride layer to provide hydrogen atoms directly to both the first active layer and second gate electrode.

2. The array substrate according to claim 1, wherein the second active layer is arranged on a surface of the second source/drain electrodes that is distant from the base and is electrically connected to a source electrode and a drain electrode of the second source/drain electrodes.

3. The array substrate according to claim 1, wherein the first active layer and the second gate electrode are located in a structure of the same layer and are formed in the same fabrication operation.

4. The array substrate according to claim 3, wherein the first interlayer insulation layer and the second gate insulation layer are both formed of a silicon oxide material and the first interlayer insulation layer and the second gate insulation layer are located in a structure of the same layer and are formed in the same fabrication operation.

5. The array substrate according to claim 4, wherein the first source/drain electrodes and the second source/drain electrodes are both formed of aluminum metal, wherein the first source/drain electrodes and the second source/drain electrodes functions, as working in combination with the first interlayer insulation layer and the second gate insulation layer, as a hydrogen blocking layer in treatment of ion activation/hydrogenation conducted on amorphous materials of the first active layer and the first gate electrode.

6. The array substrate according to claim 1, wherein the first thin-film transistor comprise a P type thin-film transistor and the second thin-film transistor comprises an N type thin-film transistor, the second thin-film transistor being directly connected to a pixel electrode for image displaying to drive the pixel electrode to carry out image displaying.

7. A method for manufacturing an array substrate, comprising the following steps:
    providing a base plate and forming a buffer layer on one side of the base plate;
    forming and patterning a poly-silicon layer on a surface of the buffer layer to form a first active layer and a second gate electrode that are spaced from each other by a predetermined distance that are spaced from each other by a predetermined distance in a first direction;
    forming, sequentially on a surface of the first active layer in a third direction, a first gate insulation layer and a first gate electrode that are stacked, the third direction being perpendicular to the first direction and extending in a direction away from the base;
    forming an insulation layer on the first gate electrode, the first gate insulation layer, and the second gate electrode, wherein a portion of the insulation layer that corresponds to and covers the first gate insulation layer and the first gate electrode forms a first interlayer insulation layer; and a portion of the insulation layer that corresponds to and covers the second gate electrode forms a second gate insulation layer;
    forming a metal layer on the first interlayer insulation layer and the second gate insulation layer;

subjecting amorphous materials of the first active layer and the first gate electrode to ion activation/hydrogenation;

patterning the metal layer, wherein first source/drain electrodes are formed at locations corresponding to two sides of the first gate electrode in the first direction and the first source/drain electrodes are electrically connected to the first active layer, the first active layer, the first gate insulation layer, the first gate electrode, the first interlayer insulation layer, and the first source/drain electrodes collectively forming a first thin-film transistor; second source/drain electrodes being formed at locations corresponding to two sides of the second gate electrode in the first direction; and forming a second active layer to correspond to the second source/drain electrodes, the second gate electrode, the second gate insulation layer, the second source/drain electrodes, and the second active layer collectively forming a second thin-film transistor, wherein the buffer layer comprises a silicon oxide layer and a silicon nitride layer, wherein the silicon nitride layer is closer to the first active layer and the second gate electrode than the silicon oxide layer, such that the buffer layer is located between the base and each of the first active layer and the second gate electrode and each of the first active layer and the second gate electrode is in direct contact with the silicon nitride layer of the buffer layer, wherein the direct contact between the silicon nitride of the buffer layer and each of the first active layer and second gate electrode allows the silicon nitride layer to provide hydrogen atoms directly to both the first active layer and second gate electrode.

8. The method for manufacturing an array substrate according to claim 7, wherein the metal layer is formed of a material comprising aluminum, the metal layer functioning, in combination with the first interlayer insulation layer and the second gate insulation layer, as a hydrogen blocking layer in ion activation/hydrogenation.

\* \* \* \* \*